United States Patent
Waseda et al.

(10) Patent No.: US 12,033,852 B2
(45) Date of Patent: *Jul. 9, 2024

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Takayuki Waseda, Toyama (JP); Takashi Nakagawa, Toyama (JP); Kimihiko Nakatani, Toyama (JP); Motomu Degai, Toyama (JP); Yoshitomo Hashimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/748,841

(22) Filed: May 19, 2022

(65) Prior Publication Data

US 2022/0277955 A1 Sep. 1, 2022

Related U.S. Application Data

(63) Continuation of application No. 16/943,150, filed on Jul. 30, 2020, now Pat. No. 11,417,518.

(30) Foreign Application Priority Data

Jul. 31, 2019 (JP) .................................. 2019-140991

(51) Int. Cl.
*H01L 21/02* (2006.01)
*C23C 16/02* (2006.01)
(Continued)

(52) U.S. Cl.
CPC .... *H01L 21/02312* (2013.01); *C23C 16/0227* (2013.01); *C23C 16/345* (2013.01);
(Continued)

(58) Field of Classification Search
CPC .......... H01L 21/02312; H01L 21/0217; H01L 21/02238; H01L 21/02359; H01L 21/0228;
(Continued)

(56) References Cited

U.S. PATENT DOCUMENTS 10,460,930 B2 * 10/2019 Hausmann ........ H01L 21/02304
10,559,461 B2 * 2/2020 Reddy ............... H01L 21/02178
(Continued)

FOREIGN PATENT DOCUMENTS

| CN | 103715131 A | 4/2014 |
|---|---|---|
| JP | 2013-243193 A | 12/2013 |
| JP | 2017-174919 A | 9/2017 |

OTHER PUBLICATIONS

Taiwanese Office Action issued on May 8, 2024 for Taiwan Patent Application No. 111149596.

*Primary Examiner* — Yasser A Abdelaziez
(74) *Attorney, Agent, or Firm* — Volpe Koenig

(57) ABSTRACT

There is method of processing a substrate comprising: (a) providing the substrate with a first base containing no oxygen, a second base containing oxygen, and a third base containing no oxygen and no nitrogen on its surface, wherein a protective film is formed on a surface of the third base; (b) modifying a surface of the second base to be fluorine-terminated by supplying a fluorine-containing gas to the substrate in a state where the protective film is formed on the surface of the third base; and (c) forming a film on a
(Continued)

surface of the first base by supplying a film-forming gas to the substrate in a state where the surface of the second base is modified.

20 Claims, 6 Drawing Sheets

(51) Int. Cl.
*C23C 16/34* (2006.01)
*C23C 16/458* (2006.01)

(52) U.S. Cl.
CPC ...... *C23C 16/4584* (2013.01); *H01L 21/0217* (2013.01); *H01L 21/02238* (2013.01); *H01L 21/02359* (2013.01); *H01L 21/0228* (2013.01)

(58) Field of Classification Search
CPC ......... H01L 21/02104; H01L 21/02107; H01L 21/67207; H01L 21/02057; H01L 21/02164; H01L 21/67017; H01L 21/02532; C23C 16/0227; C23C 16/345; C23C 16/4584; C23C 16/0272; C23C 16/04; C23C 16/401; C23C 16/45534; C23C 16/042

See application file for complete search history.

(56) References Cited

U.S. PATENT DOCUMENTS

| | | |
|---|---|---|
| 2008/0146025 A1* | 6/2008 | Dordi ...................... C23C 10/60 438/643 |
| 2013/0329274 A1* | 12/2013 | Yang ................... G02B 26/005 359/290 |
| 2016/0148800 A1* | 5/2016 | Henri ................ H01L 21/02592 438/503 |
| 2016/0322213 A1 | 11/2016 | Thompson et al. |
| 2017/0278705 A1 | 9/2017 | Murakami et al. |
| 2017/0323778 A1 | 11/2017 | Godet |
| 2018/0166270 A1 | 6/2018 | Cho et al. |
| 2018/0261447 A1 | 9/2018 | Smith et al. |
| 2018/0269058 A1 | 9/2018 | Smith et al. |
| 2019/0198318 A1 | 6/2019 | Bhuyan et al. |

\* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a continuation of U.S. Ser. No. 16/943,150, filed Jul. 30, 2020 which is based upon and claims benefit of priority from Japanese Patent Application No. 2019-140991, filed on Jul. 31, 2019, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film by selectively growing it on a surface of a specific base among a plurality of kinds of bases exposed on a surface of a substrate (hereinafter, referred to as selective growth or selective film formation) is often carried out.

SUMMARY

The present disclosure provides some embodiments of a technique capable of enhancing a selectivity in the selective growth described above while suppressing damage to a surface of a base.

According to one or more embodiments of the present disclosure, there is provided a technique that includes (a) forming a protective film on a surface of a third base by supplying a processing gas to a substrate in which a first base containing no oxygen, a second base containing oxygen, and the third base containing no oxygen and no nitrogen are exposed on a surface of the substrate; (b) modifying a surface of the second base to be fluorine-terminated by supplying a fluorine-containing gas to the substrate after the protective film is formed on the surface of the third base; and (c) selectively forming a film on a surface of the first base by supplying a film-forming gas to the substrate after the surface of the second base is modified.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Embodiments of the present disclosure will now be described mainly with reference to FIGS. 1 to 4.

(1) Configuration of the Substrate Processing Apparatus

Figure 1:
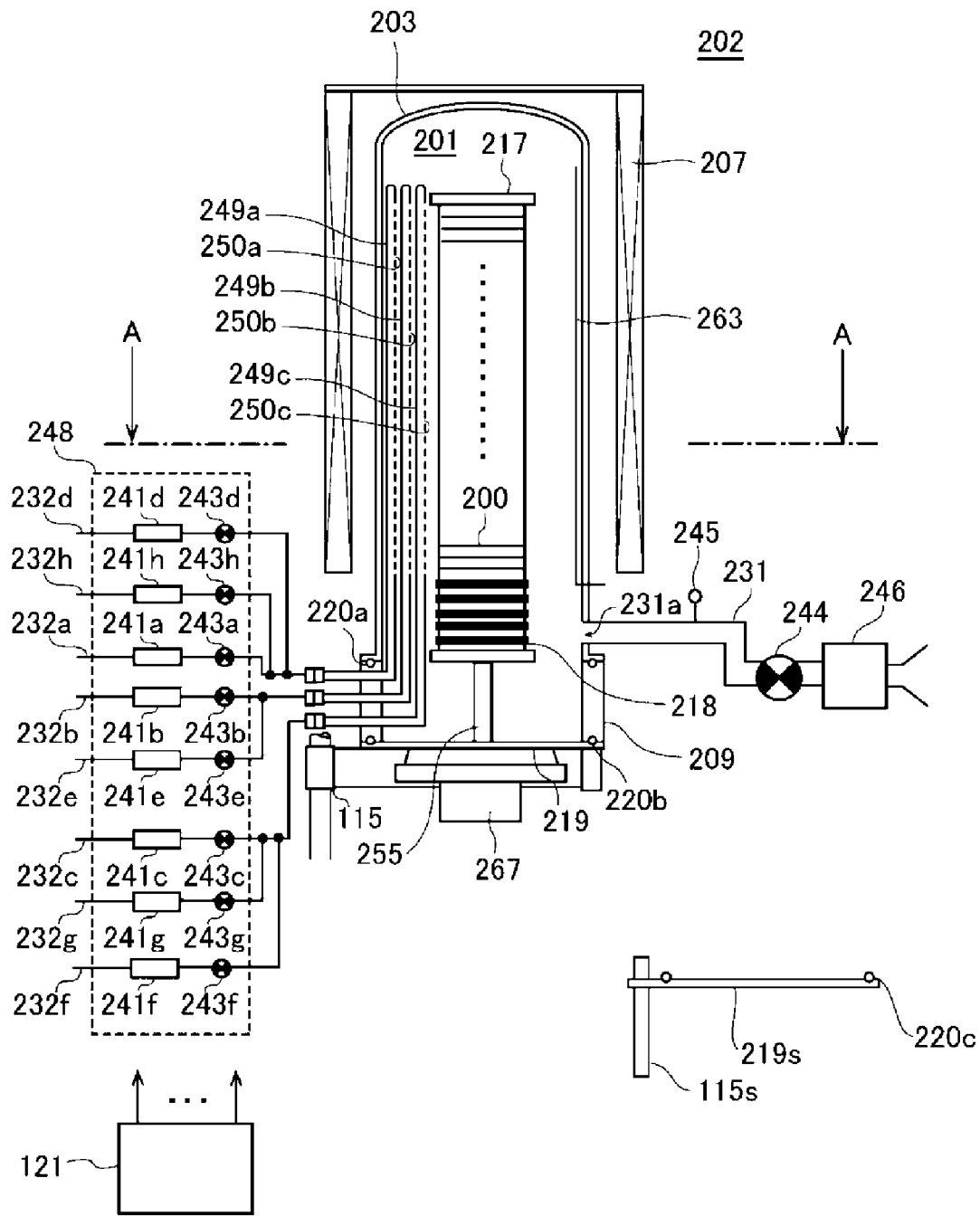
FIG. 1 is a schematic configuration view of a vertical type process furnace of a substrate processing apparatus suitably used in embodiments of the present disclosure, in which a portion of a process furnace 202 is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207.

The reaction tube 203 is composed of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is composed of a metal material, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to accommodate wafers 200 as substrates. The process to the wafers 200 is performed in the process chamber 201.

Nozzles 249a to 249c as first to third supply parts are installed in the process chamber 201 to penetrate a sidewall of the manifold 209. The nozzles 249a to 249c will be referred to as first to third nozzles, respectively. The nozzles 249a to 249c are each composed of a heat resistant material such as quartz, SiC, or the like. Gas supply pipes 232a to 232c are connected to the nozzles 249a to 249c, respectively. The nozzles 249a to 249c are different nozzles, in which each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in the gas supply pipes 232a to 232c sequentially from the upstream sides of gas flow, respectively. Gas supply pipes 232d to 232h are connected to the gas supply pipes 232a to 232c at the downstream side of the valves 243a to 243c, respectively. MFCs 241d to 241h and valves 243d to 243h are installed in the gas supply pipes 232d to 232h sequentially from the upstream sides of gas flow, respectively. The gas supply pipes 232a to 232h are each composed of a metal material such as, e.g., stainless steel (SUS) or the like.

Figure 2:
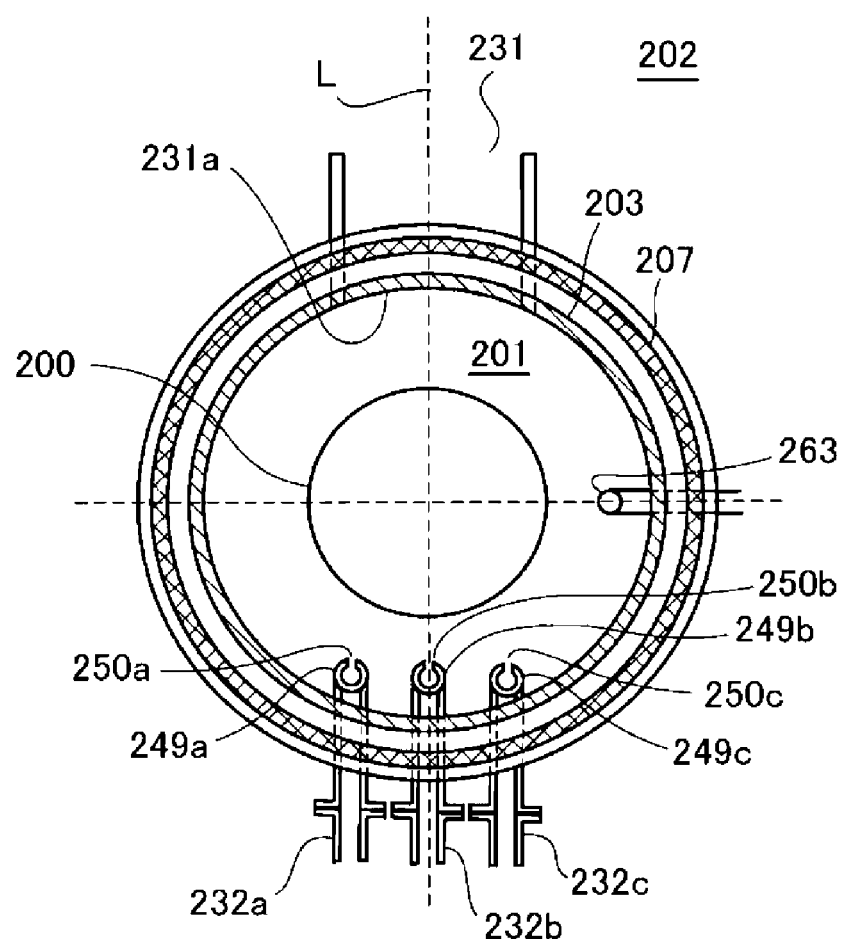
FIG. 2 is a schematic configuration view of a vertical type process furnace of the substrate processing apparatus suitably used in embodiments of the present disclosure, in which a portion of the process furnace 202 is shown in a cross sectional view taken along line A-A in FIG. 1.

As illustrated in FIG. 2, the nozzles 249a to 249c are each disposed in a space with an annular shape in a plane view between the inner wall of the reaction tube 203 and the wafers 200 such that the nozzles 249a to 249c extend upward along an arrangement direction of the wafers 200 from a lower portion of the inner wall of the reaction tube 203 to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a, which will be described later, on a straight line in a plane view, with the centers of the wafers 200 carried into the process chamber 201 interposed therebetween. The nozzles 249a and 249c are disposed to sandwich a straight line L passing through the nozzle 249b and the center of the exhaust port 231a from both sides along the inner wall of the reaction tube 203 (the outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c for supplying a gas are installed on the side surfaces of the nozzles 249a to 249c, respectively. The gas supply holes 250a to 250c are opened to face the exhaust port 231a in a plane view, so as to allow a gas to be supplied toward the wafers 200. The gas supply holes 250a to 250c may be formed in a plural number between the lower portion of the reaction tube 203 and the upper portion of the reaction tube 203.

A gas, which contains silicon (Si) as a main element constituting a film to be formed on each of the wafers 200 and a halogen element, i.e., a halosilane-based gas, is supplied from the gas supply pipe 232a into the process chamber 201 via the MFC 241a, the valve 243a, and the nozzle 249a. The halosilane-based gas acts as a film-forming gas, i.e., a Si source (precursor gas). The halogen element includes chlorine (Cl), fluorine (F), bromine (Br), iodine (I), and the like. As the halosilane-based gas, it may be possible to use, for example, a chlorosilane-based gas containing Si and Cl, for example, a silicon tetrachloride ($SiCl_4$) gas.

A fluorine (F)-containing gas is supplied from the gas supply pipe 232b into the process chamber 201 via the MFC 241b, the valve 243b, and the nozzle 249b. As the fluorine-containing gas, it may be possible to use, for example, a fluorine ($F_2$) gas.

A hydrogen nitride-based gas, which is a nitrogen (N)-containing gas, is supplied from the gas supply pipe 232c into the process chamber 201 via the MFC 241c, the valve 243c, and the nozzle 249c. The hydrogen nitride-based gas acts as a film-forming gas, i.e., a N source (a nitriding gas or a nitriding agent). As the hydrogen nitride-based gas, it may be possible to use, for example, an ammonia ($NH_3$) gas.

An aminosilane-based gas, which is a gas containing Si and an amino group, is supplied from the gas supply pipe 232g into the process chamber 201 via the MFC 241g, the valve 243g, the gas supply pipe 232c, and the nozzle 249c.

As the aminosilane-based gas, it may be possible to use, for example, a monoaminosilane ($SiH_3R$) gas which is a precursor containing one amino group in a composition formula (in one molecule). R refers to an amino group in which one or two hydrocarbon groups containing one or more C atoms are coordinated to one N atom (the one in which one or both of H of an amino group represented by $NH_2$ is substituted by a hydrocarbon group containing one or more C atoms). When two hydrocarbon groups each constituting a portion of the amino group are coordinated to one N, the two hydrocarbon groups may be the same hydrocarbon group or different hydrocarbon groups.

Furthermore, the hydrocarbon group may contain an unsaturated bond such as a double bond or a triple bond. Moreover, the amino group may have a cyclic structure. Since the amino group is bonded to Si, which is the central atom of the $SiH_3R$ molecule, this amino group will also be referred to as a ligand or an amino ligand.

As the $SiH_3R$ gas, it may be possible to use, for example, an ethylmethylaminosilane ($SiH_3[N(CH_3)(C_2H_5)]$) gas, a dimethylaminosilane ($SiH_3[N(CH_3)_2]$) gas, a diisopropylaminosilane ($SiH_3[N(C_3H_7)_2]$) gas, a disecondary butylaminosilane ($SiH_3[H(C_4H_9)_2]$) gas, a dimethylpiperidinosilane ($SiH_3[NC_5H_8(CH_3)_2]$) gas, or a diethylpiperidinosilane ($SiH_3[NC_5H_8(C_2H_5)_2]$) gas.

An oxygen (O)-containing gas is supplied from the gas supply pipe 232h into the process chamber 201 via the MFC 241h, the valve 243h, the gas supply pipe 232a, and the nozzle 249a. The O-containing gas acts as a processing gas, i.e., an oxidizing agent. As the O-containing gas, it may be possible to use, for example, an oxygen ($O_2$) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c. The $N_2$ gas acts as a purge gas, a carrier gas, a dilution gas, or the like.

A film-forming gas supply system (a precursor gas supply system or a reaction gas supply system) mainly includes the gas supply pipes 232a and 232c, the MFCs 241a and 241c, and the valves 243a and 243c. A processing gas supply system (an oxygen-containing gas supply system) mainly includes the gas supply pipe 232h, the MFC 241h, and the valve 243h. An aminosilane-based gas supply system mainly includes the gas supply pipe 232g, the MFC 241g, and the valve 243g. A fluorine-containing gas supply system mainly includes the gas supply pipe 232b, the MFC 241b, and the valve 243b. An inert gas supply system mainly includes the gas supply pipes 232d to 232f, the MFCs 241d to 241f, and the valves 243d to 243f.

One or more of various supply systems described above may be configured as an integrated supply system 248 in which the valves 243a to 243h, the MFCs 241a to 241h, and the like are integrated. The integrated supply system 248 is connected to each of the gas supply pipes 232a to 243h so that a supply operation of various kinds of gases into the gas supply pipes 232a to 232h, i.e., an opening/closing operation of the valves 243a to 243h, a flow-rate-adjusting operation by the MFCs 241a to 241h or the like, is controlled by a controller 121 which will be described later. The integrated supply system 248 is configured as an integral type or division type integrated unit, and is also configured so that it is detachable from the gas supply pipes 232a to 232h or the like, so as to perform maintenance, replacement, expansion, or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in a plane view, with the wafers 200 interposed therebetween. The exhaust port 231a may be installed between the lower portion of the sidewall of the reaction tube 203 and the upper portion of the sidewall of the reaction tube 203, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an APC (auto pressure controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is composed of a metal material such as, e.g., stainless steel (SUS) or the like, and is formed in a disc shape. An O-ring 220b, which is a seal making contact with the lower end portion of the manifold 209, is installed on an upper surface of the seal cap 219.

A rotator 267 configured to rotate a boat 217, which will be described later, is installed under the seal cap 219. A rotary shaft 255 of the rotator 267, which is composed of a metal material such as stainless steel or the like and penetrates the seal cap 219, is connected to the boat 217. The rotator 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up and down.

A shutter 219s as a furnace opening cover capable of hermetically seal the lower end opening of the manifold 209 while moving the seal cap 219 down to unload the boat 217 from the interior of the process chamber 201 is installed under the manifold 209. The shutter 219s is composed of a metal material such as stainless steel or the like, and is formed in a disc shape. An O-ring 220c as a seal making contact with the lower end portion of the manifold 209 is installed on an upper surface of the shutter 219s. An opening/closing operation (an up-down movement operation or a rotational movement operation) of the shutter 219s is controlled by a shutter-opening/closing mechanism 115s.

The boat 217 serving as a substrate holder is configured to hold a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is composed of a heat resistant material such as quartz or SiC. Heat-insulating plates 218 composed of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
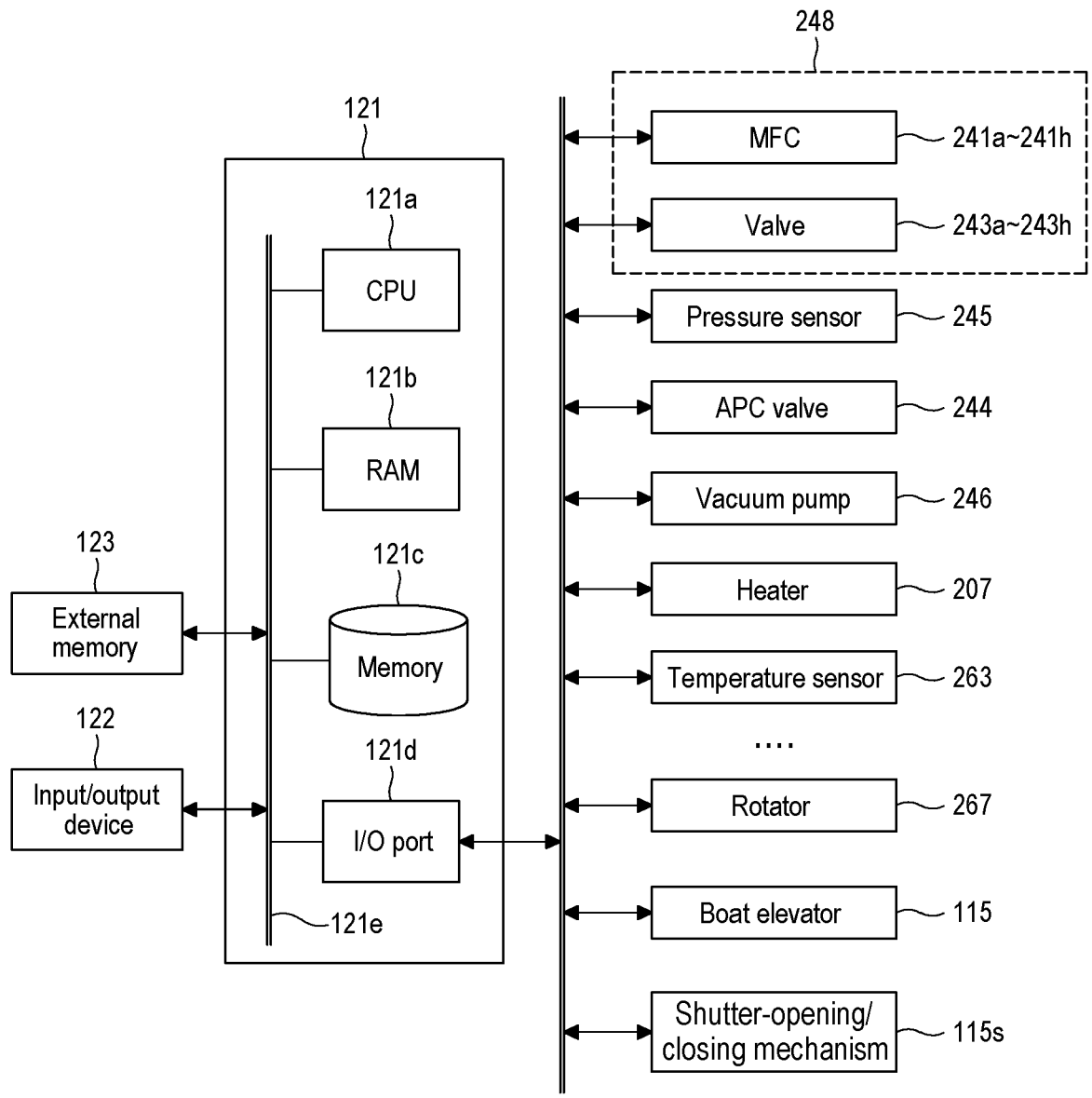
FIG. 3 is a schematic configuration view of a controller 121 of the substrate processing apparatus suitably used in embodiments of the present disclosure, in which a control system of the controller 121 is shown in a block diagram.

As illustrated in FIG. 3, the controller 121, which is a control part (control means), may be configured as a computer including a CPU (central processing unit) 121a, a RAM (random access memory) 121b, a memory 121c, and an I/O port 121d. The RAM 121b, the memory 121c, and the I/O port 121d are configured to exchange data with the CPU 121a via an internal bus 121e. An input/output device 122 formed of, e.g., a touch panel or the like, is connected to the controller 121.

The memory 121c is configured by, for example, a flash memory, a HDD (hard disk drive), or the like. A control program for controlling operations of a substrate processing apparatus, a process recipe for specifying sequences and conditions of substrate processing as described hereinbelow, or the like is readably stored in the memory 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including the recipe, a case of including the control program, or a case of including both the recipe and the control program. The RAM 121b is configured as a memory area (work area) in which a program, data, and the like read by the CPU 121a is temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotator 267, the boat elevator 115, the shutter-opening/closing mechanism 115s, and the like, as described above.

The CPU 121a is configured to read the control program from the memory 121c and execute the same. The CPU 121a is also configured to read the recipe from the memory 121c according to an input of an operation command from the input/output device 122. In addition, the CPU 121a is configured to control, according to the contents of the recipe thus read, the flow-rate-adjusting operation of various kinds of gases by the MFCs 241a to 241h, the opening/closing operation of the valves 243a to 243h, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 and adjusting the rotation speed of the boat 217 with the rotator 267, the operation of moving the boat 217 up and down with the boat elevator 115, the operation of opening and closing the shutter 219s with the shutter-opening/closing mechanism 115s, and the like.

The controller 121 may be configured by installing, on the computer, the aforementioned program stored in an external memory 123. The external memory 123 may include, for example, a magnetic disc such as a HDD, an optical disc such as a CD, a magneto-optical disc such as a MO, a semiconductor memory such as a USB memory, and the like. The memory 121c or the external memory 123 is configured as a computer-readable recording medium. Hereinafter, the memory 121c and the external memory 123 will be generally and simply referred to as a "recording medium." When the term "recording medium" is used herein, it may indicate a case of including the memory 121c, a case of including the external memory 123, or a case of including both the memory 121c and the external memory 123. Furthermore, the program may be supplied to the computer by using a communication means such as the Internet or a dedicated line, instead of using the external memory 123.

(2) Substrate-Processing Process

A process sequence example of selective growth (selective film formation) in which a film is formed by selectively growing it on a surface of a specific base among a plurality of kinds of bases exposed on a surface a wafer 200 as a substrate using the aforementioned substrate processing apparatus, which is one of the processes for manufacturing a semiconductor device, will be described mainly with reference to FIGS. 4, and 5A to 5G. In the following descriptions, the operations of the respective parts constituting the substrate processing apparatus are controlled by the controller 121.

Figure 4:
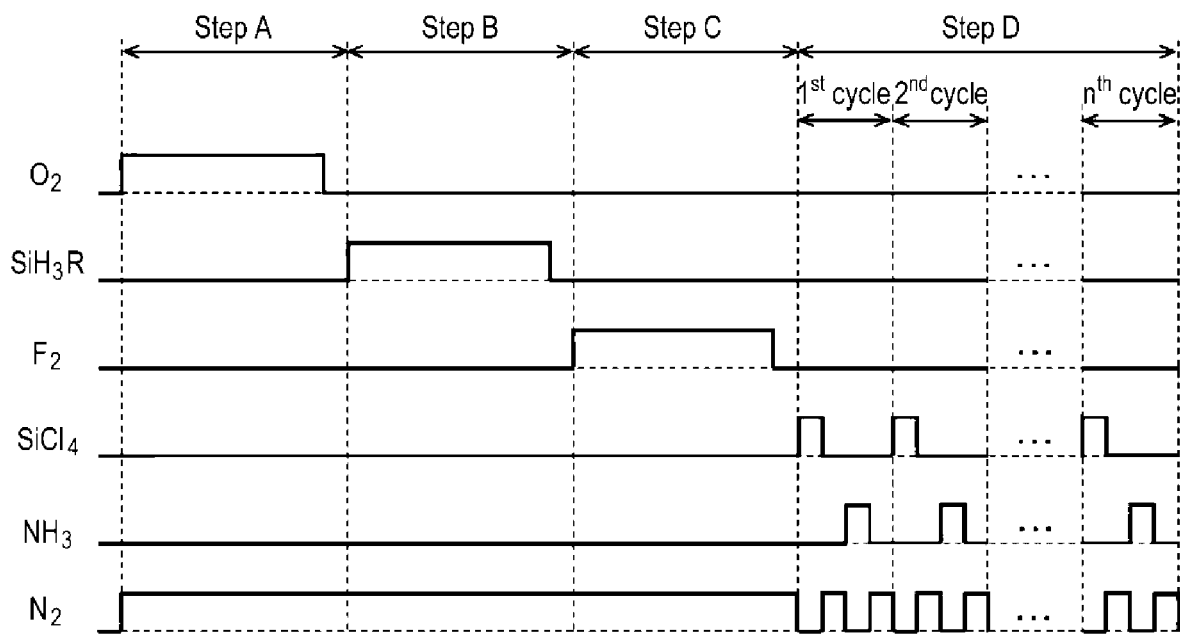
FIG. 4 is a view illustrating a process sequence in selective growth according to embodiments of the present disclosure.

In the process sequence illustrated in FIG. 4, there are performed: step A of forming a SiO film as a protective film 200e on a surface of a base 200c by supplying an $O_2$ gas as a processing gas to a wafer 200 in which an O-free first base (base 200a) including a silicon nitride film (SiN film), an O-containing second base (base 200b) including a silicon oxide film (SiO film), and an O- and N-free third base (base 200c) including a single crystalline silicon (Si) are exposed on its surface; step B of adsorbing Si contained in a $SiH_3R$ gas on respective surfaces of the base 200b and the protective film 200e by supplying the $SiH_3R$ gas as an aminosilane-based gas to the wafer 200 after the protective film 200e is formed on the surface of the base 200c; step C of modifying the surfaces of the base 200b and the protective film 200e by supplying an $F_2$ gas as a fluorine-containing gas to the wafer 200 after Si is adsorbed on the respective surfaces of the base 200b and the protective film 200e to react Si adsorbed on the respective surfaces of the base 200b and the protective film 200e with the $F_2$ gas; and step D of selectively forming a SiN film which is a film containing Si and N as a film on the surface of the base 200a by supplying a $SiCl_4$ gas and an $NH_3$ gas as film-forming gases to the wafer 200 after the respective surfaces of the base 200b and the protective film 200e are modified.

Furthermore, in FIG. 4, an example in which at step D, a cycle which non-simultaneously performs step D1 of supplying the $SiCl_4$ gas to the wafer 200 and step D2 of supplying the $NH_3$ gas to the wafer 200 is implemented a predetermined number of times (n times, where n is an integer of 1 or more) is illustrated.

In the present disclosure, for the sake of convenience, the process sequence described above may sometimes be denoted as follows. The same denotation will be used in other embodiments as described hereinbelow.

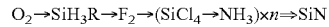

$O_2 \rightarrow SiH_3R \rightarrow F_2 \rightarrow (SiCl_4 \rightarrow NH_3) \times n \Rightarrow SiN$ When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

If a plurality of wafers 200 is charged on the boat 217 (wafer charging), the shutter 219s is moved by the shutter-opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

Figure 5A:
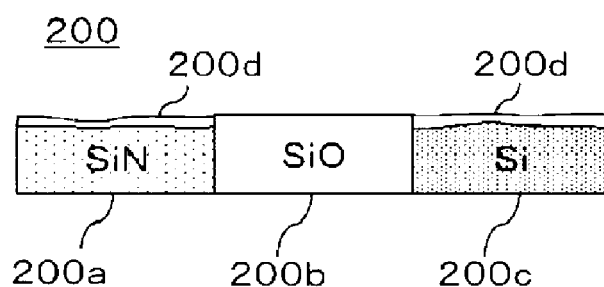
FIG. 5A is a partial enlarged cross sectional view of a surface of a wafer 200 before a cleaning process.
Figure 5B:
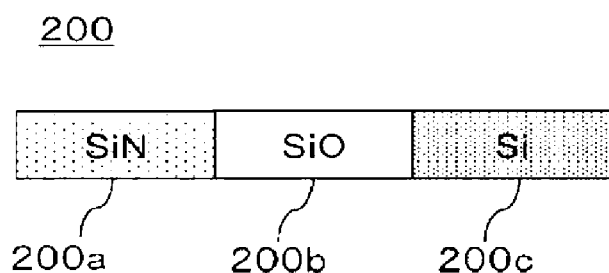
FIG. 5B is a partial enlarged cross sectional view of the surface of the wafer 200 after the cleaning process in which a base 200a containing a silicon nitride film, a base 200b containing a silicon oxide film, and a base 200c containing silicon are each exposed on its surface.

As illustrated in FIG. 5A, a plurality of kinds of bases, for example, a base 200a including a SiN film as a nitride film which is an O-free film, i.e., a non-oxide film, a base 200b including a SiO film as an O-containing film, i.e., an oxide film, and a base 200c including a single crystalline Si as an O- and N-free substance are exposed in advance on a surface of a wafer 200. That is, an example in which the base 200a is composed of a SiN film which is an insulating substance (insulator), the base 200b is composed of a SiO film which is an insulating substance (insulator), and the base 200c is composed of a single crystalline Si which is a semiconductor substance is illustrated in the present disclosure. Furthermore, as illustrated in FIG. 5A, when natural oxide films 200d are formed on the surface of the wafer 200, for example, a cleaning process (DHF cleaning) using a diluted hydrofluoric acid (DHF) aqueous solution, i.e., a hydrogen fluoride (HF) aqueous solution, is performed on the wafer 200 in advance, i.e., before boat loading, to remove the natural oxide films 200d formed on the surface of the wafer 200 (natural oxide film removal). Specifically, by performing DHF cleaning on the wafer 200 to remove the natural oxide films 200d formed on the surface of the base 200a as illustrated in FIG. 5B, the material of the base 200a, i.e., the SiN film, is exposed on the uppermost surface of the base 200a. Thus, uniform processing can be performed on the surface of the base 200a at step D as described hereinbelow. When removing the natural oxide films 200d formed on the surface of the base 200a, the natural oxide films 200d formed on the surface of the base 200c exposed on the surface of the wafer 200 are also removed, and the material of the base 200c, i.e., the single crystalline Si, is also exposed on the outermost surface of the base 200c. Thus, uniform processing can be performed on the surface of the base 200c at step A as described hereinbelow.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired processing temperature. In this operation, the degree of supplying electric power to the heater 207 is feedback-controlled based on the temperature information detected by the temperature sensor 263 such that the interior of the process chamber 201 has a desired temperature distribution. In addition, the rotation of the wafers 200 by the rotator 267 begins. The exhaust of the interior of the process chamber 201 and the heating and rotation of the wafers 200 may be continuously performed at least until the process to the wafers 200 is completed.

(Selective Growth)

Next, the following steps A to D are sequentially performed.

[Step A]

At this step, an $O_2$ gas is supplied to the wafer 200 in the process chamber 201, namely the wafer 200 in which the base 200a, the base 200b, and the base 200c are exposed on its surface, as illustrated in FIG. 5B.

Specifically, the valve 243h is opened to allow an $O_2$ gas to flow through the gas supply pipe 232h. The flow rate of the $O_2$ gas is adjusted by the MFC 241h. The $O_2$ gas is supplied into the process chamber 201 via the gas supply pipe 232a and the nozzle 249a and is exhausted from the exhaust port 231a. At this time, the $O_2$ gas is supplied to the wafer 200 ($O_2$ gas supply). Simultaneously, the valves 243e and 243f are opened to supply an $N_2$ gas into the process chamber 201 via the nozzles 249b and 249c, respectively. The supply of the $N_2$ gas may not be performed.

The examples of the processing conditions at this step may be described as follows:

$O_2$ gas supply flow rate: 10 to 10,000 sccm or 100 to 10,000 sccm in some embodiments $O_2$ gas supply time: 1 to 180 seconds or 1 to 60 seconds in some embodiments $N_2$ gas supply flow rate (per gas supply pipe): 0 to 10,000 sccm or 100 to 10,000 sccm in some embodiments Processing temperature: room temperature to 600 degrees C. or 50 to 550 degrees C. in some embodiments Processing pressure: 1 to atmospheric pressure (101,325 Pa), 10 to 5,000 Pa in some embodiments, or 100 to 1,000 Pa in some embodiments.

The conditions described herein are conditions under which the base 200c is oxidized without oxidizing the surface of the base 200a.

Furthermore, in the present disclosure, the expression of the numerical range such as "1 to 101,325 Pa" may mean that a lower limit value and an upper limit value are included in that range. Therefore, for example, "1 to 101,325 Pa" may mean "1 Pa or higher and 101,325 Pa or lower." The same applies to other numerical ranges.

Figure 5C:
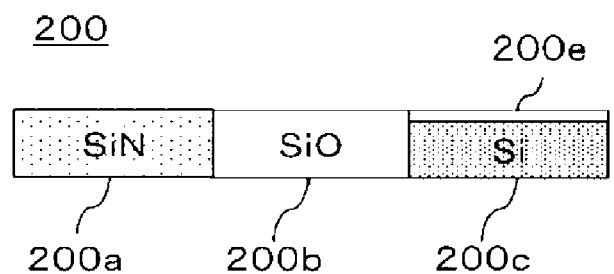
FIG. 5C is a partial enlarged cross sectional view of the surface of the wafer 200 after a protective film 200e is formed on a surface of the base 200c by supplying an oxygen-containing gas.

By supplying the $O_2$ gas to the wafer 200 under the aforementioned conditions, as illustrated in FIG. 5C, the surface of the base 200c can be selectively (preferentially) oxidized while suppressing the oxidation of the surface of the base 200a. By oxidizing the surface of the base 200c, a SiO film is formed as the protective film 200e on the surface of the base 200c. At this time, since the base 200b is composed of a SiO film, the surface of the base 200b is not oxidized and the protective film 200e is not newly formed on the surface. Such selective (preferential) oxidation is possible because the processing conditions at this step are set to conditions under which the surface of the base 200a is not oxidized, i.e., conditions under which an oxide film (SiO film or SiON film) is not formed on the surface of the base 200a. At this step, by performing dry oxidation under the conditions under which the surface of the base 200a is not oxidized, the surface of the base 200c can be selectively oxidized, i.e., the SiO film as the protective film 200e can be selectively formed on the surface of the base 200c. Furthermore, at this step, the film thickness controllability and film thickness uniformity of the protective film 200e formed on the surface of the base 200c can be enhanced by oxidizing the surface of the base 200c under a pressure condition less than an atmospheric pressure (in a vacuum atmosphere or a decompressed atmosphere).

The protective film 200e formed on the surface of the base 200c functions as a film for protecting the base 200c when a $F_2$ gas is supplied at step C as described hereinbelow. When the $F_2$ gas is brought into contact with the surface of the base 200c at step C as described hereinbelow, the surface of the base 200c may be etched and damaged by etching. By forming the protective film 200e on the surface of the base 200c, it is possible to prevent the $F_2$ gas from being brought into contact with the surface of the base 200c at step C. Therefore, it is possible to suppress the etching of the surface of the base 200c and to suppress the etching damage to the surface of the base 200c. In addition, the protective film 200e does not adversely affect each processing at steps B and C.

The film thickness of the protective film 200e formed at this step is about 10 Å, which is smaller than the film thickness of the natural oxide films 200d formed on the surface of the base 200c before the DHF cleaning. Even if the film thickness of the protective film 200e is small as described above, since the film thickness uniformity of the protective film 200e is much higher than the film thickness uniformity of the natural oxide films, it becomes possible to sufficiently suppress the contact of the $F_2$ gas with the surface of the base 200c when supplying the $F_2$ gas at step C as described hereinbelow.

After the protective film 200e is formed on the surface of the base 200c, the valve 243h is closed to stop the supply of the $O_2$ gas into the process chamber 201. Then, the interior of the process chamber 201 is vacuum-exhausted and the gas or the like remaining within the process chamber 201 is removed from the interior of the process chamber 201. At this time, the valves 243d to 243f are opened to supply a $N_2$ gas into the process chamber 201 via the nozzles 249a to 249c. The $N_2$ gas supplied from the nozzles 249a to 249c acts as a purge gas. Thus, the interior of the process chamber 201 is purged (purge).

As the O-containing gas, it may be possible to use, in addition to the $O_2$ gas, an O-containing gas such as a nitrous oxide ($N_2O$) gas, a nitric oxide (NO) gas, a nitrogen dioxide ($NO_2$) gas, an ozone ($O_3$) gas, water vapor ($H_2O$ gas), a carbon monoxide (CO) gas, a carbon dioxide ($CO_2$) gas, or the like.

As the inert gas, it may be possible to use, in addition to the $N_2$ gas, a rare gas such as an Ar gas, a He gas, a Ne gas, a Xe gas, or the like. This also applies to each step as described hereinbelow.

[Step B]

After step A is completed, a $SiH_3R$ gas is supplied to the wafer 200 in the process chamber 201, namely the wafer 200 after the protective film 200e is formed on the surface of the base 200c.

Specifically, the valve 243g is opened to allow a $SiH_3R$ gas to flow into the gas supply pipe 232g. The flow rate of the $SiH_3R$ gas is adjusted by the MFC 241g. The $SiH_3R$ gas is supplied into the process chamber 201 via the gas supply pipe 232c and the nozzle 249c and is exhausted from the exhaust port 231a. At this time, the $SiH_3R$ gas is supplied to the wafer 200 ($SiH_3R$ gas supply). Simultaneously, the valves 243d and 243e are opened to supply an $N_2$ gas into the process chamber 201 via the nozzles 249a and 249b, respectively. The supply of the $N_2$ gas may not be performed.

The examples of the processing conditions at this step may be described as follows: $SiH_3R$ gas supply flow rate: 1 to 2,000 sccm or 1 to 500 sccm in some embodiments $SiH_3R$ gas supply time: 1 second to 60 minutes $N_2$ gas supply flow rate (per gas supply pipe): 0 to 10,000 sccm Processing temperature: room temperature (25 degrees C.) to 600 degrees C. or room temperature to 450 degrees C. in some embodiments Processing pressure: 1 to 2,000 Pa or 1 to 1,000 Pa in some embodiments.

The conditions described herein are conditions under which the $SiH_3R$ gas is not gas-phase decomposed (pyrolyzed) in the process chamber 201. Furthermore, the base 200b and the protective film 200e includes surfaces terminated with hydroxyl groups (OH) over the entire region (entire surface). The base 200a includes a surface in which many regions are not OH-terminated, namely a surface in which some regions are OH-terminated.

Figure 5D:
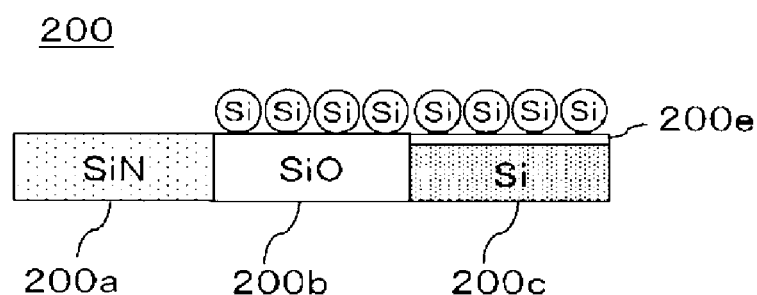
FIG. 5D is a partial enlarged cross sectional view of the surface of the wafer 200 after silicon is selectively adsorbed on respective surfaces of the base 200b and the protective film 200e by supplying an aminosilane-based gas.

By supplying the $SiH_3R$ gas to the wafer 200 under the aforementioned conditions, as illustrated in FIG. 5D, Si contained in the $SiH_3R$ gas can be selectively (preferentially) adsorbed on the surface of the base 200b while suppressing the adsorption of Si contained in the $SiH_3R$ gas on the surface of the base 200a. At this time, Si contained in the $SiH_3R$ gas can be selectively (preferentially) adsorbed on the surface of the protective film 200e. Furthermore, at this time, Si contained in the $SiH_3R$ gas may be adsorbed on a portion of the surface of the base 200a, but the adsorption amount of Si is smaller than the adsorption amount of Si on the respective surfaces of the base 200b and the protective film 200e. The reason why such selective (preferential) adsorption is possible is because the processing conditions at this step are set to the conditions under which the $SiH_3R$ gas is not gas-phase decomposed in the process chamber 201. Another reason is because the respective surfaces of the base 200b and the protective film 200e are OH-terminated over the entire region, whereas many regions of the surface of the base 200a are not OH-terminated (some regions of the surface are OH-terminated). At this step, since the $SiH_3R$ gas is not gas-phase decomposed in the process chamber 201, Si contained in $SiH_3R$ is not multiple-deposited on the respective surfaces of the bases 200a and 200b and the protective film 200e. At this step, on the respective surfaces of the base 200b and the protective film 200e, the OH-termination formed on the entire region of the surfaces reacts with $SiH_3R$ to chemisorb Si contained in $SiH_3R$ on the entire region of the respective surfaces of the base 200b and the protective film 200e. On the other hand, since the OH-termination does not exist in many regions of the surface of the base 200a, Si contained in $SiH_3R$ is not chemisorbed in such many regions. However, the OH-termination formed in some regions of the surface of the base 200a and $SiH_3R$ may react with each other to chemisorb Si contained in $SiH_3R$ on such some regions. In addition, when Si contained in $SiH_3R$ is chemisorbed on the surface of the base, it is chemisorbed in a state where H is bonded to Si.

Furthermore, if the supply of the $SiH_3R$ gas is continued for a predetermined period of time, the chemisorption of Si on the respective surfaces of the base 200b and the protective film 200e is saturated. That is, the chemisorption of Si on the respective surfaces of the base 200b and the protective film 200e is self-limited. In other words, when a Si layer of one layer is formed on the respective surfaces of the base 200b and the protective film 200e, Si is no longer chemisorbed on the respective surfaces of the base 200b and the protective film 200e. As a result, the amounts of Si adsorbed on the respective surfaces of the base 200b and the protective film 200e become substantially uniform over the entire region of the respective surfaces of the base 200b and the protective film 200e.

After Si is selectively adsorbed on the respective surfaces of the base 200b and the protective film 200e, the valve 243g is closed to stop the supply of the $SiH_3R$ gas into the process chamber 201. Then, the gas or the like, which remains within the process chamber 201, is removed from the interior of the process chamber 201 according to the same processing procedures as those of the purge at step A.

As the aminosilane-based gas, it may be possible to use, in addition to the aforementioned monoaminosilane gas containing one amino group in one molecule, a diaminosilane ($SiH_2RR'$) gas containing two amino groups in one molecule, or a triaminosilane ($SiHRR'R''$) gas containing three amino groups in one molecule.

In addition, as the aminosilane-based gas, it may be possible to use an aminosilane compound represented by the following chemical formula [1]:

$$SiA_x[(NB_2)_{(4-x)}] \quad [1]$$

In the formula [1], A indicates a hydrogen atom, an alkyl group such as a methyl group, an ethyl group, a propyl group or a butyl group, or an alkoxy group such as a methoxy group, an ethoxy group, a propoxy group or a butoxy group. The alkyl group may be not only a linear alkyl group but also a branched alkyl group such as an isopropyl group, an isobutyl group, a secondary butyl group, a tertiary butyl group or the like. The alkoxy group may be not only a linear alkoxy group but also a branched alkoxy group such as an isopropoxy group, an isobutoxy group or the like. B indicates a hydrogen atom or an alkyl group such as a methyl group, an ethyl group, a propyl group, a butyl group or the like. The alkyl group may be not only a linear alkyl group but also a branched alkyl group such as an isopropyl group, an isobutyl group, a secondary butyl group, a tertiary butyl group or the like. A plurality of A's may be equal or different, two B's may be equal or different, and x is an integer of 1 to 3.

[Step C]

After step B is completed, a F$_2$ gas is supplied to the wafer 200 in the process chamber 201, namely the wafer 200 after Si is selectively adsorbed on the respective surfaces of the base 200b and the protective film 200e.

Specifically, the valve 243b is opened to allow a F$_2$ gas to flow into the gas supply pipe 232b. The flow rate of the F$_2$ gas is adjusted by the MFC 241b. The F$_2$ gas is supplied into the process chamber 201 via the nozzle 249b and is exhausted from the exhaust port 231a. At this time, the F$_2$ gas is supplied to the wafer 200 (F$_2$ gas supply). Simultaneously, the valves 243d and 243f are opened to supply a N$_2$ gas into the process chamber 201 via the nozzles 249a and 249c. The supply of the N$_2$ gas may not be performed.

The examples of the processing conditions at this step may be described as follows: F$_2$ gas supply flow rate: 1 to 2,000 sccm or 1 to 500 sccm in some embodiments F$_2$ gas supply time: 1 second to 60 minutes Processing temperature: room temperature to 550 degrees C. or room temperature to 450 degrees C. in some embodiments.

Other conditions may be similar to the processing conditions of step B. The conditions described herein are conditions under which the respective surfaces of the base 200b and the protective film 200e are not etched, and conditions under which the respective surfaces of the base 200b and the protective film 200e are modified (F-terminated), as will be described later.

By supplying the F$_2$ gas to the wafer 200 under the aforementioned conditions, the respective surfaces of the base 200b and the protective film 200e can be modified without etching by reacting Si adsorbed on the respective surfaces of the base 200b and the protective film 200e and the F$_2$ gas with each other. At this time, since the surface of the base 200c is protected by the protective film 200e, it is possible to prevent the F$_2$ gas from being brought into contact with the surface of the base 200c. Thus, it is possible to avoid the etching damage to the surface of the base 200c. The modified base 200b and protective film 200e include F-terminated (SiF-terminated) surfaces. Furthermore, when attention is paid to atoms existing on the respective outermost surfaces of the modified base 200b and protective film 200e, it can be said that the base 200b and the protective film 200e include F-terminated surfaces, respectively. In addition, when attention is paid to the atoms existing on the respective outermost surfaces of the modified base 200b and protective film 200e and atoms bonded to the atoms, it can be said that the base 200b and the protective film 200e include SiF-terminated surfaces, respectively. In the present disclosure, for the sake of convenience, it is assumed that the former name will be mainly used. Since the respective surfaces of the base 200b and the protective film 200e are F-terminated, film formation reaction is not performed on the respective surfaces of the base 200b and the protective film 200e at step D as described hereinbelow. To be precise, it is possible to prolong the time until the film formation reaction occurs, namely the incubation time. Furthermore, in the case in which the organic components contained in SiH$_3$R remain on the respective surfaces of the base 200b and the protective film 200e, when Si adsorbed on the respective surfaces of the base 200b and the protective film 200e reacts with the F$_2$ gas, the organic components are removed from the respective surfaces of the base 200b and the protective film 200e.

Figure 5E:
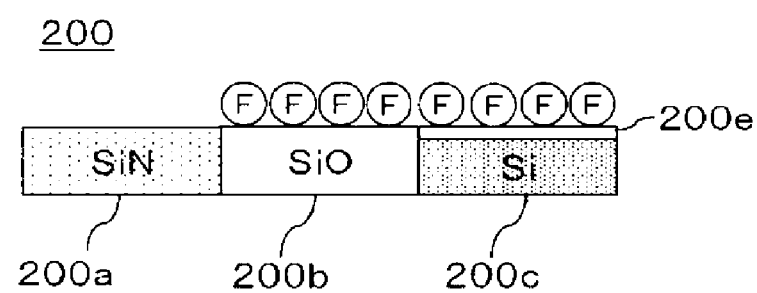
FIG. 5E is a partial enlarged cross sectional view of the surface of the wafer 200 after the respective surfaces of the base 200b and the protective film 200e, on which the silicon is adsorbed, are selectively modified by supplying a fluorine-containing gas.

As illustrated in FIG. 5E, at this step, the respective surfaces of the base 200b and the protective film 200e can be selectively (preferentially) modified while suppressing the modification of the surface of the base 200a. At this time, a portion of the surface of the base 200a may be modified, but the amount of the modification is smaller than the amount of the modification of the respective surfaces of the base 200b and the protective film 200e. Such selective (preferential) modification is possible because Si is not adsorbed on many regions of the surface of the base 200a after step B is performed, whereas Si is adsorbed on the entire region of the respective surfaces of the base 200b and the protective film 200e. Since Si is not adsorbed in many regions of the surface of the base 200a, the reaction between Si and F$_2$ is not performed, and as a result, the F-termination is not formed in such many regions. However, as described above, Si may be adsorbed on the partial region of the surface of the base 200a, and in that case, the F-termination may be formed on such partial region. On the other hand, on the entire region of the respective surfaces of the base 200b and the protective film 200e, Si adsorbed on the surfaces reacts with F$_2$ to generate an F-containing radical, and a very stable F-termination (SiF-termination) is formed on the entire region of the surfaces thereof by the action of such radical. The F-containing radical may include F, SiF, SiF$_2$, SiF$_3$, SiHF, SiH$_2$F, SiHF$_2$, and the like.

Furthermore, as described above, the amounts of Si adsorbed on the base 200b and the protective film 200e at step B are set to be substantially uniform over the entire region of the respective surfaces of the base 200b and the protective film 200e. Therefore, at this step, the amounts of the F-containing radical generated on the respective surfaces of the base 200b and the protective film 200e become substantially uniform over the entire in-plane region thereof. As a result, the modification of the base 200b and the protective film 200e described above is performed substantially uniformly over the entire region of the surfaces thereof.

Furthermore, since Si is not adsorbed in many regions of the surface of the base 200a as described above, the reaction between Si and F$_2$ is not performed, no F-containing radical is generated, and such many regions are not modified. However, when Si is adsorbed in the partial region of the surface of the base 200a, Si and F$_2$ react with each other in the partial region thereof to generate the F-containing radical, and the partial region thereof may be modified, as described above. As a result, the surface of the base 200a is hardly damaged by etching, and adsorption sites are kept in many regions of the surface.

After the respective surfaces of the base 200b and the protective film 200e among the bases 200a and 200b and the protective film 200e are selectively modified, the valve 243b is closed to stop the supply of the F$_2$ gas into the process chamber 201. Then, the gas or the like, which remains within the process chamber 201, is removed from the interior of the process chamber 201 according to the same processing procedures as those of the purge at step A.

As the fluorine-containing gas, it may be possible to use, in addition to the F$_2$ gas, a chlorine trifluoride (ClF$_3$) gas, a chlorine fluoride gas (ClF) gas, an F$_2$+nitric oxide (NO) gas, a ClF+NO gas, a nitrogen trifluoride (NF$_3$) gas, a tungsten hexafluoride (WF$_6$) gas, a nitrosyl fluoride (FNO) gas, or a mixed gas thereof.

[Step D]

After step C is completed, a SiCl$_4$ gas and an NH$_3$ gas are supplied to the wafer 200 in the process chamber 201, namely the wafer 200 after the respective surfaces of the base 200b and the protective film 200e are modified. At this step, steps D1 and D2 are sequentially performed.

[Step D1]

At this step, a $SiCl_4$ is applied to the wafer 200 in the process chamber 201, namely the wafer 200 after the respective surfaces of the base 200b and the protective film 200e among the bases 200a and 200b and the protective film 200e are selectively modified.

Specifically, the valve 243a is opened to allow a $SiCl_4$ gas to flow into the gas supply pipe 232a. The flow rate of the $SiCl_4$ gas is adjusted by the MFC 241a. The $SiCl_4$ gas is supplied into the process chamber 201 via the nozzle 249a and is exhausted from the exhaust port 231a. At this time, the $SiCl_4$ gas is supplied to the wafer 200 ($SiCl_4$ gas supply). Simultaneously, the valves 243e and 243f may be opened to supply an $N_2$ gas into the process chamber 201 via the nozzles 249b and 249c, respectively.

The examples of the processing conditions at this step may be described as follows: $SiCl_4$ gas supply flow rate: 1 to 2,000 sccm or 10 to 1,000 sccm in some embodiments $SiCl_4$ gas supply time: 1 to 180 seconds or 10 to 120 seconds in some embodiments Processing temperature: 350 to 600 degrees C. or 400 to 550 degrees C. in some embodiments Processing pressure: 1 to 2,000 Pa or 10 to 1,333 Pa in some embodiments.

Other processing conditions may be similar to the processing conditions of step B.

By supplying the $SiCl_4$ gas to the wafer 200 under the aforementioned conditions, a Si-containing layer containing Cl is formed on the surface of the base 200a including unmodified regions of the bases 200a and 200b and the protective film 200e. That is, the Si-containing layer containing Cl is formed starting from the unmodified region of the base 200a, namely the region in which the adsorption sites are kept. The Si-containing layer containing Cl is formed by physisorption or chemisorption of $SiCl_4$ on the surface of the base 200a, chemisorption of a substance ($SiCl_x$) in which a portion of $SiCl_4$ is decomposed, deposition of Si by pyrolysis of $SiCl_4$, or the like. The Si-containing layer containing Cl may be an adsorption layer of $SiCl_4$ or $SiCl_x$ (a physisorption layer or a chemisorption layer), or may be a deposit layer of Si containing Cl. In the present disclosure, the Si-containing layer containing Cl will be simply referred to as a Si-containing layer.

At this step, the Si-containing layer can be selectively formed on the surface of the base 200a while suppressing the formation of the Si-containing layer on the respective surfaces of the base 200b and the protective film 200e. In addition, when the respective surfaces of the base 200b and the protective film 200e are insufficiently modified due to certain factors, the Si-containing layer may be very slightly formed on the respective surfaces of the base 200b and the protective film 200e, but also in this case, the thickness of the Si-containing layer formed on the respective surfaces of the base 200b and the protective film 200e becomes much smaller than the thickness of the Si-containing layer formed on the surface of the base 200a. Such selective formation of the Si-containing layer is possible because the F-termination existing on the respective surfaces of the base 200b and the protective film 200e acts as a factor that inhibits the formation of the Si-containing layer (adsorption of Si) on the respective surfaces of the base 200b and the protective film 200e, i.e., as an inhibitor. Furthermore, the F-terminations existing on the respective surfaces of the base 200b and the protective film 200e are stably kept without being eliminated even when this step is performed.

After the Si-containing layer is formed on the surface of the base 200a, the valve 243a is closed to stop the supply of the $SiCl_4$ gas into the process chamber 201. Then, the gas or the like, which remains within the process chamber 201, is removed from the interior of the process chamber 201 according to the same processing procedures as those of the purge at step A (purge).

As the precursor gas (film-forming gas), it may be possible to use, in addition to the $SiCl_4$ gas, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a hexachlorodisilane ($Si_2Cl_6$, abbreviation: HCDS) gas, an octachlorotrisilane ($Si_3Cl_8$, abbreviation: OCTS) gas or the like, a bromosilane-based gas such as a tetrabromosilane ($SiBr_4$) gas or the like, or an iodosilane-based gas such as a tetraiodosilane ($SiI_4$) gas or the like.

[Step D2]

At this step, an $NH_3$ gas is supplied to the wafer 200 in the process chamber 201, namely to the Si-containing layer formed on the surface of the base 200a.

Specifically, the valve 243c is opened to allow an $NH_3$ gas to flow into the gas supply pipe 232c. The flow rate of the $NH_3$ gas is adjusted by the MFC 241c. The $NH_3$ gas is supplied into the process chamber 201 via the nozzle 249c and is exhausted from the exhaust port 231a. At this time, the $NH_3$ gas is supplied to the wafer 200 ($NH_3$ gas supply). Simultaneously, the valves 243d and 243e may be opened to supply an $N_2$ gas into the process chamber 201 via the nozzles 249a and 249b, respectively.

The examples of the processing conditions at this step may be described as follows:

$NH_3$ gas supply flow rate: 10 to 10,000 sccm $NH_3$ gas supply time: 1 to 60 seconds or 5 to 50 seconds in some embodiments Processing pressure: 1 to 4,000 Pa or 1 to 1,333 Pa in some embodiments.

Other processing conditions may be similar to the processing conditions of step B.

By supplying the $NH_3$ gas to the wafer 200 under the aforementioned conditions, at least a portion of the Si-containing layer formed on the surface of the base 200a is nitrided. By nitriding the Si-containing layer, a layer containing Si and N, i.e., a silicon nitride layer (SiN layer), is formed on the surface of the base 200a. When forming the SiN layer, an impurity such as Cl contained in the Si-containing layer constitutes a gaseous substance containing at least Cl in the process of the nitriding reaction of the Si-containing layer with the $NH_3$ gas, and is discharged from the interior of the process chamber 201. Thus, the SiN layer becomes a layer containing a smaller amount of impurity such as Cl or the like than that of the Si-containing layer formed at step D1. Furthermore, the respective surfaces of the base 200b and the protective film 200e are kept without being nitrided even when this step is performed. That is, the respective surfaces of the base 200b and the protective film 200e are stably kept while being F-terminated without being nitrided (NH-terminated).

After the SiN layer is formed on the surface of the base 200a, the valve 243c is closed to stop the supply of the $NH_3$ gas into the process chamber 201. Then, the gas or the like, which remains within the process chamber 201, is removed from the interior of the process chamber 201 according to the same processing procedures as those of the purge at step A (purge).

As the reaction gas (film-forming gas), it may be possible to use, in addition to the $NH_3$ gas, for example, a hydrogen nitride-based gas such as a diazene ($N_2H_2$) gas, a hydrazine ($N_2H_4$) gas, a $N_3H_8$ gas, or the like.

[Performing a Predetermined Number of Times]

Figure 5F:
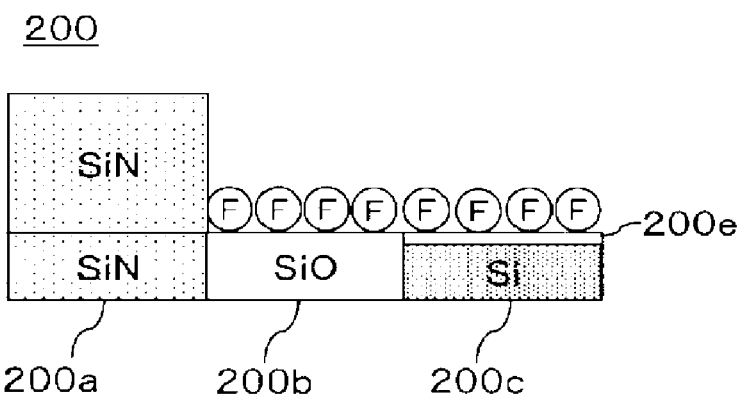
FIG. 5F is a partial enlarged cross sectional view of the surface of the wafer 200 after a silicon nitride film is selectively formed on a surface of the base 200a, and FIG. 5G is a partial enlarged cross sectional view of the surface of the wafer 200 after the wafer 200 illustrated in FIG. 5F is exposed to the atmosphere.

A cycle which non-simultaneously, i.e., non-synchronously, performs steps D1 and D2 described above is implemented a predetermined number of times (n times, where n is an integer of 1 or more). Thus, a SiN film can be selectively formed on the surface of the base 200a among the bases 200a and 200b and the protective film 200e exposed on the surface of the wafer 200, as illustrated in FIG. 5F. The aforementioned cycle may be repeated multiple times. That is, the thickness of the SiN layer formed per one cycle may be set smaller than a desired film thickness, and the aforementioned cycle may be repeated multiple times until the film thickness of a film formed by laminating the SiN layer becomes equal to the desired film thickness.

Furthermore, when performing steps D1 and D2, since the F-terminations existing on the respective surfaces of the base 200b and the protective film 200e are kept without being eliminated, the action as the inhibitor is maintained and no SiN film is formed on the respective surfaces of the base 200b and the protective film 200e. However, if the respective surfaces of the base 200b and the protective film 200e are not sufficiently modified due to certain factors, the SiN film may be very slightly formed on the respective surfaces of the base 200b and the protective film 200e, but also in this case, the thickness of the SiN film formed on the respective surfaces of the base 200b and the protective film 200e becomes much smaller than the thickness of the SiN film formed on the surface of the base 200a. In the present disclosure, the expression "the SiN film is selectively formed on the surface of the base 200a" among the bases 200a and 200b and the protective film 200e may include not only a case where no SiN film is formed on the respective surfaces of the base 200b and the protective film 200e, but also a case where a very thin SiN film is formed on the respective surfaces of the base 200b and the protective film 200e, as described above.

(After-Purge and Atmospheric Pressure Return)

After the selective formation of the SiN film on the base 200a is completed, the $N_2$ gas as a purge gas is supplied from each of the nozzles 249a to 249c into the process chamber 201 and is exhausted from the exhaust port 231a. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

Figure 5G:
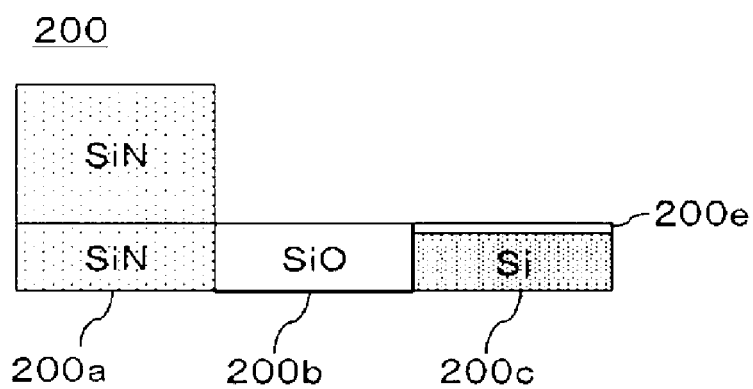

Furthermore, as illustrated in FIG. 5G, the F-terminations existing on the respective surfaces of the base 200b and the protective film 200e are dissociated by reacting with a predetermined reaction product, specifically, moisture ($H_2O$) in the atmosphere, when the processed wafers 200 are exposed to the atmosphere. That is, the F-terminations existing on the respective surfaces of the base 200b and the protective film 200e can be removed by the exposure of the processed wafers 200 to the atmosphere. By removing the F-terminations from the respective surfaces of the base 200b and the protective film 200e, the respective surface states of the base 200b and the protective film 200e are reset, and the film-forming process can be performed on the respective surfaces of the base 200b and the protective film 200e at a subsequent step.

(3) Effects According to the Present Embodiments

According to the present embodiments, one or more effects as set forth below may be achieved.

(a) By performing steps A to D, it becomes possible to selectively form the SiN film on the surface of the base 200a among the bases 200a, 200b, and 200c exposed on the surface of the wafer 200. This makes it possible to simplify their processes, such as omitting a patterning process including photolithography, for example, when manufacturing a semiconductor device. As a result, it is possible to improve the productivity of the semiconductor device and to reduce the manufacturing cost.

(b) By forming the SiO film as the protective film 200e on the surface of the base 200c at step A, since the $F_2$ gas is not brought into contact with the surface of the base 200c at step C, it is possible to suppress the etching damage to the surface of the base 200c. That is, it is possible to modify the respective surfaces of the base 200b and the protective film 200e while suppressing the etching damage to the base 200c by the $F_2$ gas at step C.

In this case, it may also be considered that the natural oxide film (SiO film) formed on the surface of the base 200c before the DHF cleaning is used as the protective film. However, since the natural oxide film has a non-uniform thickness, when the natural oxide film is used as the protective film, the surface of the base 200c may be etched and damaged by etching by bringing the $F_2$ gas into contact with the base 200c in a portion where the film thickness of the natural oxide film is small at step C.

(c) Since the film thickness of the protective film 200e is as small as about 10 Å, it may not be necessary to perform the step of removing the protective film 200e after the selective growth is completed. In this case, since the manufacturing process of the semiconductor device can be simplified, it is possible to improve the productivity of the semiconductor device and to reduce the manufacturing cost. However, when the SiO film formed as the protective film 200e influences the device characteristics or the like, it is desirable to remove the protective film 200e. In that case, it is possible to remove the protective film 200e by, for example, DHF cleaning or the like.

(d) By performing the DHF cleaning to remove the natural oxide films 200d formed on the surface of the base 200a and exposing the surface of the base 200c before performing step A, it is possible to form the SiN film with high film thickness uniformity on the surface of the base 200c at step D. Furthermore, by removing the natural oxide films 200d formed on the surface of the base 200c to expose the surface of the base 200c, it is possible to form the protective film 200e with high film thickness uniformity on the surface of the base 200c by uniformly oxidizing the surface of the base 200c at step A.

(e) At step B, the amounts of Si selectively (preferentially) adsorbed on the base 200b and the protective film 200e can be set to be substantially uniform over the entire region of the respective surfaces of the base 200b and the protective film 200e. This makes it possible to substantially uniformly modify the entire region of the respective surfaces of the base 200b and the protective film 200e at step C. As a result, it is possible to substantially uniformly and reliably inhibit the formation of the SiN film on the base 200b and the protective film 200e over the entire region of the surfaces thereof at step D. That is, it is possible to enhance the selectivity in the selective growth.

(f) By exposing the processed wafer 200 to the atmosphere after performing step D, it is possible to eliminate the F-terminations as inhibitors existing on the respective surfaces of the base 200b and the protective film 200e. As described above, since the F-terminations can be easily removed, it is may not be necessary to separately prepare a step of removing the inhibitors. Thus, it is possible to simplify the manufacturing process of the semiconductor device, to improve the productivity of the semiconductor device, and to reduce the manufacturing cost.

(g) Since at least one selected from the group of steps A to D or each of steps A to D in some embodiments is performed in a non-plasma atmosphere, it is possible to avoid plasma damage to the wafer 200, and also to apply it to the process concerned with plasma damage of the present disclosure.

(h) The effects mentioned above can be similarly achieved in the case where an oxygen-containing gas other than the $O_2$ gas is used, or in the case where an aminosilane-based gas other than the $SiHR_3$ gas is used, or in the case where a fluorine-containing gas other than the $F_2$ gas is used, or in the case where a precursor gas other than the $SiCl_4$ gas is used, or in the case where a reaction gas other than the $NH_3$ gas is used, or in the case where an inert gas other than the $N_2$ gas is used.

Other Embodiments of the Present Disclosure

While one or more embodiments of the present disclosure have been specifically described above, the present disclosure is not limited to the aforementioned embodiments but may be variously modified without departing from the spirit of the present disclosure.

In the aforementioned embodiments, there has been described an example in which Si is selectively adsorbed on the respective surfaces of the base 200b and the protective film 200e by supplying the aminosilane-based gas to the wafer 200 at step B, and the respective surfaces of the base 200b and the protective film 200e are modified without etching by supplying the F-containing gas to the wafer 200 to react Si adsorbed on the respective surfaces of the base 200b and the protective film 200e with the F-containing gas at step C, but the present disclosure is not limited to the aforementioned embodiments. For example, at step C, the F-containing radical is generated by supplying the F-containing gas in an atmosphere in which a pseudo catalyst exists and the respective surfaces of the base 200b and the protective film 200e may be modified without etching using the F-containing radical thus generated. That is, at step C, the F-containing radical is generated by supplying the F-containing gas into the process chamber 201 accommodating the pseudo catalyst, and the respective surfaces of the base 200b and the protective film 200e among the bases 200a and 200b and the protective film 200e may be selectively (preferentially) modified without etching by supplying the radical thus generated to the surface of the wafer 200. In this case, step B cannot be performed.

The term "pseudo catalyst" herein refers to a substance of promoting the decomposition of the F-containing gas and urging the generation of the F-containing radical from the F-containing gas. The generation of the F-containing radical from the F-containing gas can be promoted by the pseudo catalytic action occurring by bringing the F-containing gas into contact with the pseudo catalyst to efficiently generate the F-containing radical.

As the pseudo catalyst, it may be possible to use, for example, Si of a solid whose outermost surface is not covered with a natural oxide film (SiO film), i.e., a Si member is exposed by exposing a Si material on the outermost surface. For example, a wafer made of Si from which the natural oxide film formed on the outermost surface is removed by DHF cleaning or the like, for example, a bare Si wafer (hereinafter, referred to as a bare wafer), may be used as such a member. In addition, the natural oxide film is formed on the outermost surface of the bare wafer stored in the atmosphere and the Si material is not exposed on the outermost surface, and therefore, the bare wafer cannot be used as the pseudo catalyst as it is. In order for the bare wafer to act as the pseudo catalyst, it may be necessary to remove the natural oxide film formed on the outermost surface of the bare wafer when performing step C and to create a state in which the Si material is exposed on the outermost surface.

When the bare wafer is used as the pseudo catalyst, the bare wafer from which the Si material is exposed on the uppermost surface is held at a predetermined position of the boat 217 together with the wafer 200 to be processed, and the bare wafer as the pseudo catalyst can be accommodated in the process chamber 201 by loading the boat 217 into the process chamber 201 in that state. Furthermore, in this case, it is desirable that the bare wafer as the pseudo catalyst and the wafer 200 to be processed be alternately charged on the boat 217 every other sheet, and the bare wafer be arranged directly above the base 200b and just above the protective film 200e by allowing the upper surface of the wafer 200 to be processed and the surface of the bare wafer as the pseudo catalyst to face each other. In this case, at step C, the F-containing radical can be efficiently generated by bringing the F-containing gas into contact with the bare wafer as the pseudo catalyst, and the F-containing radical efficiently generated in this way can be efficiently supplied to each of the base 200b and the protective film 200e. As a result, it becomes possible to appropriately modify the respective surfaces of the base 200b and the protective film 200e.

The processing procedures and processing conditions for the selective growth in this case may be similar to the processing procedures and processing conditions of the aforementioned embodiments, except that the bare wafer as the pseudo catalyst is set in the boat 217 and step B is not performed, as in the gas supply sequence illustrated below.

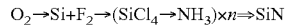

$O_2 \rightarrow Si+F_2 \rightarrow (SiCl_4 \rightarrow NH_3) \times n \Rightarrow SiN$ Even in this case, the same effects as those of the aforementioned embodiments may be achieved. Furthermore, by supplying the F-containing gas in an atmosphere in which the pseudo catalyst exists at step C, it is possible to increase the amount of the F-containing radical generated by more promoting the generation of the F-containing radical in the process chamber 201 than in the case where the F-containing gas is supplied in an atmosphere in which the pseudo catalyst does not exist. As a result, by promoting the modification of the respective surfaces of the base 200b and the protective film 200e at step C, it is possible to appropriately perform the selective formation of the SiN film on the surface of the base 200a. Moreover, by using the pseudo catalyst, it is possible to lower the processing temperature at step C, and to effectively suppress the etching of the surface of the base 200a or the etching damage to the surface of the base 200a at step C.

In addition, instead of the bare wafer, a plate made of Si (Si plate), a chip made of Si (Si chip), a piece made of Si (Si piece), a block made of Si (Si block), or the like may be used as the pseudo catalyst. Even when these are used as the pseudo catalyst, it may be necessary to remove the natural oxide film formed on their outermost surfaces and to create a state in which the Si material is exposed on the outermost surfaces, as in the case of using the bare wafer as the pseudo catalyst.

Furthermore, before performing step C, a Si film is formed (precoated) in advance on the surface of any member (the inner wall of the reaction tube 203, the surface of the boat 217, or the like) in the process chamber 201, and this Si film (precoated film) may also be used as the pseudo catalyst. The Si film as the precoated film may be formed, for example, by using a silane-based gas such as a monosilane ($SiH_4$) gas or the like and by a CVD method. The Si film may be a Si film in an amorphous (non-crystalline) state, a Si film in a poly (polycrystalline) state, or a Si film in a mixed state of amorphous and polycrystal.

The examples of the processing conditions when forming the Si film may be described as follows:

$SiH_4$ gas supply flow rate: 10 to 2,000 sccm
$N_2$ gas supply flow rate (per gas supply pipe): 0 to 10,000 sccm
Gas supply time: 10 to 400 minutes
Processing temperature: 450 to 550 degrees C. or 450 to 530 degrees C. in some embodiments
Processing pressure: 1 to 900 Pa.

In this case, at step C, the F-containing radical can be efficiently generated by bringing the F-containing gas into contact with the Si film (precoated film) as the pseudo catalyst, and the F-containing radical efficiently generated in this way can be efficiently supplied to the base 200b and the protective film 200e. As a result, it becomes possible to appropriately modify the respective surfaces of the base 200b and the protective film 200e.

Furthermore, in addition to the Si film, a SiN film, a silicon carbide film (SiC film), a silicon carbonitride film (SiCN film), a silicon-rich SiN film (SiRN film), a silicon-rich SiC film (SiRC film), a silicon-rich SiCN film (SiRCN film), or the like may be used as the precoated film. That is, in addition to Si, a Si-containing film containing C or N may be used as the precoated film. The SiN film, the SiC film, the SiCN film, the SiRN film, the SiRC film, and the SiRCN film as the precoated films may be formed, for example, using an aminosilane-based gas such as an ethylmethylaminosilane ($SiH_3[N(CH_3)(C_2H_5)]$) gas, a dimethylaminosilane ($SiH_3[N(CH_3)_2]$) gas, a diisopropylaminosilane ($SiH_3[N(C_3H_7)_2]$) gas, a disecondary butylaminosilane ($SiH_3[H(C_4H_9)_2]$) gas or the like and by the CVD method. The processing conditions at this time may be similar to the processing conditions when forming the Si film as the precoated film described above. Furthermore, the aminosilane-based gas is a gas containing Si and an amino group, and may be a gas containing at least Si, N, and C as constituent elements.

Also, in these cases, at step C, the F-containing radical can be efficiently generated by bringing the F-containing radicals into contact with the SiN film, the SiC film, the SiCN film, the SiRN film, the SiRC film, or the SiRCN film (precoated film) as the pseudo catalyst, and the F-containing radical efficiently generated in this way can be efficiently supplied to each of the base 200b and the protective film 200e. As a result, it becomes possible to appropriately modify the respective surfaces of the base 200b and the protective film 200e.

The processing procedures and processing conditions in the selective growth when these precoated films are used as the pseudo catalysts may be similar to the processing procedures and processing conditions of the aforementioned embodiments except that these films are precoated on the surface of any member in the process chamber 201 and step B is not performed. As described above, even when the precoated film is used as the pseudo catalyst, the same effects as those when the bare wafer is used as the pseudo catalyst may be achieved. The precoated film in this case may be referred to as a pseudo catalyst film or a pseudo catalyst precoated film.

In addition, after the wafer 200 to be processed is accommodated in the process chamber 201 and before step C is performed, a Si film is formed on the surface of the wafer 200, i.e., on the respective surfaces of the base 200a and 200b and the protective film 200e, and this Si film may also be used as the pseudo catalyst, i.e., the pseudo catalyst film. As the pseudo catalyst film, in addition to the Si film, a SiN film, a SiC film, a SiCN film, a SiRN film, a SiRC film, a SiRCN film, or the like may be used. That is, in addition to Si, a Si-containing film containing C or N may be used as the pseudo catalyst film. A gas and processing conditions used when forming the Si film, the SiN film, the SiC film, the SiCN film, the SiRN film, the SiRC film, or the SiRCN film as the pseudo catalyst film may be similar to the gas and the processing conditions used when forming the precoated film described above.

In these cases, at step C, the F-containing radical can be efficiently generated by bringing the F-containing gas into contact with the pseudo catalyst film, and the F-containing radical efficiently generated in this way can be supplied to each of the base 200b and the protective film 200e. That is, the respective surfaces of the base 200b and the protective film 200e can be modified so as to be F-terminated. In addition, at this time, the pseudo catalyst film formed on the surface of the base 200a is etched and the adsorption site is exposed on the surface of the base 200a. At this time, the surface of the base 200a may be slightly etched, but also in that case, the etching amount is small and the adsorption site on its surface is kept. The base 200b and the protective film 200e are formed of a SiO film, and include a strong Si—O bond so that the surfaces thereof are appropriately F-terminated without etching and appropriately modified.

The processing procedures and processing conditions in the selective growth when these pseudo catalyst films are used may be similar to the processing procedures and processing conditions of the aforementioned embodiments except that the pseudo catalyst film is formed on the surface of the wafer 200 and step B is not performed. As described above, even when the Si film, the SiN film, the SiC film, the SiCN film, the SiRN film, the SiRC film, the SiRCN film, or the like is used as the pseudo catalyst, the same effects as those when the bare wafer is used as the pseudo catalyst may be achieved.

Furthermore, as the pseudo catalyst, it may be possible to use, for example, a gaseous pseudo catalyst, as well as the solid pseudo catalyst such as the bare wafer, the Si plate, the Si chip, the Si piece, the Si block, the Si-containing precoated film or the Si-containing pseudo catalyst film. As the gaseous pseudo catalyst, i.e., as the pseudo catalyst gas, it may be possible to use a gas for promoting the decomposition of the F-containing gas to generate the F-containing radical from the F-containing gas by bringing it into contact with the F-containing gas. As the pseudo catalyst gas, specifically, it may be possible to use, for example, at least one selected from the group of an $O_2$ gas, a $N_2O$ gas, a $NO_2$ gas, a NO gas, a HF gas, an $NH_3$ gas, and a hydrogen ($H_2$) gas. The supply of these gases may be performed simultaneously with the supply of the F-containing gas into the process chamber 201 using, for example, the nozzles 249a and 249c or the like.

In this case, at step C, the F-containing gas is supplied in an atmosphere in which the pseudo catalyst gas exists by simultaneously supplying the F-containing gas and the pseudo catalyst gas into the process chamber 201. At this time, the F-containing gas can be brought into contact with the pseudo catalyst gas, whereby the F-containing radical can be efficiently generated and the F-containing radical efficiently generated in this way can be efficiently supplied to each of the base 200b and the protective film 200e. As a result, it becomes possible to appropriately modify the respective surfaces of the base 200b and the protective film 200e. Furthermore, the F-containing gas and the pseudo catalyst gas may be supplied into the process chamber 201 alternately or intermittently as long as the F-containing gas and the pseudo catalyst gas are mixed in the process chamber 201.

The processing procedures and processing conditions in the selective growth at this time may be similar to the processing procedures and processing conditions of the aforementioned embodiments except that the F-containing gas and the pseudo catalyst gas are supplied into the process chamber 201 and step B is not performed. As described above, even when the F-containing gas and the pseudo catalyst gas are supplied, the same effects as those when the bare wafer is used as the pseudo catalyst may be achieved. Furthermore, even when the gaseous pseudo catalyst is used, it is possible to lower the processing temperature at step C and to effectively suppress the etching of the surface of the base 200a or the etching damage to the surface of the base 200a at step C, as in the case of using the solid pseudo catalyst.

Furthermore, the term "catalyst" refers to a substance in which itself does not change before and after a chemical reaction, but which changes the rate of reaction. The aforementioned substances exemplified as the pseudo catalysts have a catalytic action of promoting the generation of F-containing radical, but some of these substances themselves change before and after a chemical reaction. For example, the NO gas has a catalytic action, but when reacting with the F-containing gas, a portion of the molecular structure may be decomposed so that itself may change before and after a chemical reaction. As described above, even if the substance itself changes before and after the chemical reaction, the substance that changes the rate of the reaction will be referred to herein as a "pseudo catalyst."

In addition, for example, at step C, the generation of the F-containing radical from the F-containing gas may be promoted by activation (excitation) of the F-containing gas by plasma, heating, light irradiation, or the like. Even in these cases, the same effects as those of the aforementioned embodiments may be achieved. Furthermore, at step C, the generation of the F-containing radical in the process chamber 201 may be promoted by activating the F-containing gas by plasma, heating, light irradiation, or the like, compared with the case where the F-containing gas is not activated by these, making it possible to increase the amount of the F-containing radical to be generated. As a result, it is possible to promote the modification of the respective surfaces of the base 200b and the protective film 200e, and to appropriately perform the selective formation of the SiN film on the surface of the base 200a at step C. Furthermore, it is also possible to lower the processing temperature at step C. Moreover, in the case of using plasma, it is desirable that a method of activating the F-containing gas by plasma in a remote plasma unit installed outside the process chamber 201 and then supplying it into the process chamber 201, i.e., a remote plasma method, be employed in order to suppress plasma damage to the wafer 200 or any member in the process chamber 201.

In addition, in the aforementioned embodiments, there has been described an example in which steps A, B, C, and D are sequentially performed on the wafer 200 in which the base 200a including the SiN film, the base 200b including the SiO film, and the base 200c including the single crystalline Si are exposed on its surface, but the present disclosure is not limited to the aforementioned embodiments. For example, instead of the base 200a including the SiN film, a base including a SiCN film, a silicon boronitride film (SiBN film), a silicon borocarbonitride film (SiBCN film), or a silicon borocarbide film (SiBC film) may be exposed on the surface of the wafer 200. Furthermore, for example, instead of the base 200b including the SiO film, a base including a silicon oxycarbide film (SiOC film), a silicon oxynitride film (SiON film), or a silicon oxycarbonitride film (SiOCN film) may be exposed. Moreover, for example, instead of the base 200c including the single crystalline Si, a base including an epitaxial silicon film (Epi-Si film), a polysilicon film (poly-Si film (polycrystalline Si film)), or an amorphous silicon film (a-Si film (non-crystalline Si film)) may be exposed. Furthermore, for example, in addition to the base 200a including the SiN film, the base 200b including the SiO film, and the base 200c including the single crystalline Si, a base including a conductive metallic thin film such as a tungsten film (W film), a tungsten nitride film (WN film), or a titanium nitride film (TiN film) may be exposed. Also, instead of the base 200a including the SiN film, a base including the metallic thin film described above may be exposed. Even in these cases, the same effects as those of the aforementioned embodiments may be achieved. That is, it is possible to selectively form a film on the surface of the base 200a or the surface of the aforementioned metallic thin film while avoiding film formation on the bases 200b and 200c.

Furthermore, in the aforementioned embodiments, there has been described an example in which a monoaminosilane gas is used as the aminosilane-based gas at step B, but the present disclosure is not limited to the aforementioned embodiments. For example, at step B, as the aminosilane-based gas, a diaminosilane gas or a triaminosilane gas may be used instead of the monoaminosilane gas. Even in these cases, the same effects as those of the aforementioned embodiments may be achieved. However, at step B, as a gas having a smaller number of amino groups contained in one molecule is used as the aminosilane-based gas, the adsorption density of Si on the respective surfaces of the base 200b and the protective film 200e becomes higher, and at step C, the density of SiF-terminations formed on the respective surfaces of the base 200b and the protective film 200e becomes higher. As a result, at step D, it is possible to enhance the film formation inhibiting effect on the respective surfaces of the base 200b and the protective film 200e. From this viewpoint of point, it is particularly desirable to use monoaminosilane including one amino group contained in one molecule as the aminosilane-based gas.

Furthermore, in the aforementioned embodiments, there has been described an example in which a cycle which non-simultaneously performs steps D1 and D2 is implemented a predetermined number of times at step D, but the present disclosure is not limited to the aforementioned embodiments. For example, at step D, before starting the cycle which non-simultaneously performs steps D1 and D2, a step of supplying an NH$_3$ gas for a predetermined period of time (NH$_3$ preflow) may be performed on the wafer 200 in the process chamber 201, namely the wafer 200 after the respective surfaces of the base 200b and the protective film 200e among the bases 200a and 200b and the protective film 200e are selectively modified. Even in this case, since the F-terminations existing on the respective surfaces of the base 200b and the protective film 200e are stably kept without being eliminated, the same effects as those of the aforementioned embodiments may be achieved. Furthermore, the adsorption site on the surface of the base 200a can be optimized, thereby improving the quality of the SiN film formed on the base 200a.

Moreover, in the aforementioned embodiments, there has been described an example in which the SiCl$_4$ gas is used as the precursor gas and the NH$_3$ gas is used as the reaction gas at step D, but the present disclosure is not limited to the aforementioned embodiments. For example, at step D, as the precursor gas, it may be possible to use, in addition to the SiCl$_4$ gas, a metal halide gas such as the aforementioned chlorosilane-based gas or titanium tetrachloride (TiCl$_4$) gas. Furthermore, for example, as the reaction gas, it may be possible to use, in addition to the N-containing gas such as an NH$_3$ gas, an O-containing gas such as an oxygen (O$_2$) gas, a N- and C-containing gas such as a triethylamine ((C$_2$H$_5$)$_3$N, abbreviation: TEA) gas, a C-containing gas such as a propylene (C$_3$H$_6$) gas, or a boron (B)-containing gas such as a trichloroborane (BCl$_3$) gas. In addition, a film such as a SiON film, a SiCN film, a SiOCN film, a SiOC film, a SiBN film, a SiBCN film, a TiN film, a titanium oxide nitride film (TiON film) or the like may be formed on the surface of the base 200a which is not modified, among the bases 200a and 200b and the protective film 200e, by the gas supply sequences illustrated below. The F-terminations formed on the surfaces of the bases 200b and 200c are very stable, and therefore, in these cases, i.e., when a gas containing an OH group such as water vapor (H$_2$O gas) or the like is not used as the film-forming gas, the same effects as those of the aforementioned embodiments may be achieved.

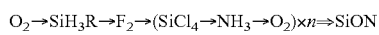

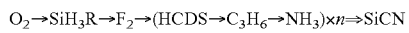

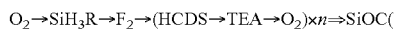

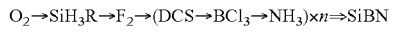

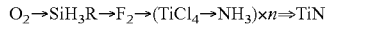

O$_2$→SiH$_3$R→F$_2$→(TiCl$_4$→NH$_3$→O$_2$)×n⇒TiON

Furthermore, in the aforementioned embodiments, there has been described an example in which the DHF cleaning is performed on the wafer 200 before performing the selective growth, but the present disclosure is not limited to aforementioned embodiments. For example, after forming the base 200a, when the natural oxide films 200d are not formed on the surfaces of the bases 200a and 200c as in the case of performing the selective growth described above without exposing the bases 200a and 200c to the atmosphere, the DHF cleaning may not be performed.

Recipes used in each processing may be prepared individually according to the processing contents and may be stored in the memory 121c via a telecommunication line or the external memory 123. Moreover, at the start of each processing, the CPU 121a may properly select an appropriate recipe from the recipes stored in the memory 121c according to the processing contents. Thus, it is possible for a single substrate processing apparatus to form films of different kinds, composition ratios, qualities and film thicknesses with enhanced reproducibility. In addition, it is possible to reduce an operator's burden and to quickly start each processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, each processing may be performed by the processing procedures and processing conditions similar to those of the aforementioned embodiments. Effects similar to those of the aforementioned embodiments may be achieved.

The embodiments described above may be appropriately combined with one another. The processing procedures and processing conditions at this time may be similar to, for example, the processing procedures and processing conditions of the aforementioned embodiments.

Examples

A plurality of wafers each including a SiN film (first base), a SiO film (second base), and a single crystalline Si (third base) exposed on its surface were prepared. The surface of each wafer was cleaned using a DHF aqueous solution to remove natural oxide films formed on the surfaces of the SiN film and the single crystalline Si in each wafer. Thereafter, a process of forming a SiN film on each wafer using the substrate processing apparatus illustrated in FIG. 1 was performed to produce two evaluation samples (samples 1 and 2).

When producing sample 1 (example), steps A to D in the aforementioned embodiments were each performed. The processing conditions at steps A to D were set to predetermined conditions which fall within the processing condition range described in the aforementioned embodiments.

When producing sample 2 (comparative example), step A in the aforementioned embodiments was not performed, and steps B to D were each performed. The processing conditions at each of steps B to D were set similar to the processing conditions at each of steps B to D when producing sample 1.

As results of observing both a SEM image and a TEM image of cross sections of samples 1 and 2, it could be confirmed that in sample 1 in which step A was performed, the surface of the third base was not damaged by etching. On the other hand, in sample 2 in which step A was not performed, it was confirmed that the surface of the third base was damaged by etching. Furthermore, it was confirmed that in any of samples 1 and 2, the SiN film could be selectively formed on the surface of the first base.

According to the present disclosure in some embodiments, it is possible to enhance a selectivity in the selective growth described above while suppressing damage to a surface of a base.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate comprising:
   (a) providing the substrate with a first base containing no oxygen, a second base containing oxygen, and a third base containing no oxygen and no nitrogen on its surface, wherein a protective film is formed on a surface of the third base;
   (b) modifying a surface of the second base to be fluorine-terminated by supplying a fluorine-containing gas to the substrate in a state where the protective film is formed on the surface of the third base; and
   (c) forming a film on a surface of the first base by supplying a film-forming gas to the substrate in a state where the surface of the second base is modified.

2. The method according to claim 1, wherein the protective film contains oxygen.

3. The method according to claim 1, wherein the protective film contains silicon and oxygen.

4. The method according to claim 2, wherein the protective film is formed by oxidizing the surface of the third base.

5. The method according to claim 2, wherein the protective film is formed by oxidizing the surface of the third base by oxidizing agent.

6. The method according to claim 2, wherein the protective film is formed by oxidizing the surface of the third base under a condition in which the surface of the first base is not oxidized.

7. The method according to claim 2, wherein in (b), a surface of the protective film is modified to be fluorine-terminated.

8. The method according to claim 1, wherein in (b), the surface of the second base is modified to be fluorine-terminated without etching.

9. The method according to claim 1, wherein in (b), the fluorine-containing gas is supplied to the substrate in an atmosphere in which silicon exists.

10. The method according to claim 1, wherein (b) comprises:
    (b1) supplying an aminosilane-based gas to the substrate; and
    (b2) supplying the fluorine-containing gas to the substrate.

11. The method according to claim 1, wherein (b) comprises:
    (b1) adsorbing silicon on the surface of the second base, and
    (b2) fluorine-terminating the surface of the second base by reacting the silicon adsorbed on the surface of the second base with the fluorine-containing gas.

12. The method according to claim 11, wherein in (b1), the silicon is adsorbed on a surface of the protective film, and wherein in (b2), the surface of the protective film is fluorine-terminated by reacting the silicon adsorbed on the surface of the protective film with the fluorine-containing gas.

13. The method according to claim 1, further comprising:
    (d) removing a natural oxide film formed on the surface of the substrate before performing (a).

14. The method according to claim 13, wherein in (d), a material of the first base is exposed.

15. The method according to claim 1, wherein the first base includes a nitride film, the second base includes an oxide film, and the third base includes a semiconductor material.

16. The method according to claim 1, wherein the first base contains silicon and nitrogen, the second base contains silicon and oxygen, and the third base contains silicon.

17. The method according to claim 1, wherein the first base includes a silicon nitride film, the second base includes a silicon oxide film, and the third base includes at least one selected from the group of a single crystalline silicon, an epitaxial silicon film, a polycrystalline silicon film, and an amorphous silicon film.

18. A method of manufacturing a semiconductor device comprising the method of claim 1.

19. A substrate processing apparatus, comprising:
    a process chamber in which a substrate is processed;
    a fluorine-containing gas supply system configured to supply a fluorine-containing gas to the substrate in the process chamber;
    a film-forming gas supply system configured to supply a film-forming gas to the substrate in the process chamber; and
    a controller configured to be capable of controlling an operation of the substrate processing apparatus so as to perform a process comprising: (a) providing the substrate with a first base containing no oxygen, a second base containing oxygen, and a third base containing no oxygen and no nitrogen on its surface, wherein a protective film is formed on a surface of the third base; (b) modifying a surface of the second base to be fluorine-terminated by supplying the fluorine-containing gas to the substrate in a state where the protective film is formed on the surface of the third base; and (c) forming a film on a surface of the first base by supplying the film-forming gas to the substrate in a state where the surface of the second base is modified.

20. A non-transitory computer-readable recording medium storing a program that causes, by a computer, a substrate processing apparatus to perform a process comprising:
    (a) providing a substrate with a first base containing no oxygen, a second base containing oxygen, and a third base containing no oxygen and no nitrogen on its surface, wherein a protective film is formed on a surface of the third base;

(b) modifying a surface of the second base to be fluorine-terminated by supplying a fluorine-containing gas to the substrate in a state where the protective film is formed on the surface of the third base; and (c) forming a film on a surface of the first base by supplying a film-forming gas to the substrate in a state where the surface of the second base is modified.

* * * * *